(12) United States Patent
Minev et al.

(10) Patent No.: US 10,468,740 B2
(45) Date of Patent: Nov. 5, 2019

(54) TECHNIQUES FOR COUPLING PLANAR QUBITS TO NON-PLANAR RESONATORS AND RELATED SYSTEMS AND METHODS

(71) Applicant: Yale University, New Haven, CT (US)

(72) Inventors: Zlatko Minev, New Haven, CT (US); Kyle Serniak, New Haven, CT (US); Ioan Pop, Karlsruhe (DE); Yiwen Chu, New Haven, CT (US); Teresa Brecht, New Haven, CT (US); Luigi Frunzio, North Haven, CT (US); Michel Devoret, New Haven, CT (US); Robert J. Schoelkopf, III, Madison, CT (US)

(73) Assignee: Yale University, New Haven, CT (US)

(*) Notice: Subject to any disclaimer, the term of this patent is extended or adjusted under 35 U.S.C. 154(b) by 54 days.

(21) Appl. No.: 15/553,012

(22) PCT Filed: Feb. 26, 2016

(86) PCT No.: PCT/US2016/019801
§ 371 (c)(1),
(2) Date: Aug. 23, 2017

(87) PCT Pub. No.: WO2016/138395
PCT Pub. Date: Sep. 1, 2016

(65) Prior Publication Data
US 2018/0069288 A1    Mar. 8, 2018

Related U.S. Application Data

(60) Provisional application No. 62/126,183, filed on Feb. 27, 2015.

(51) Int. Cl.
*H01P 7/06*    (2006.01)
*G06N 10/00*   (2019.01)
*H01L 39/02*   (2006.01)

(52) U.S. Cl.
CPC .............. *H01P 7/065* (2013.01); *G06N 10/00* (2019.01); *H01L 39/02* (2013.01)

(58) Field of Classification Search
CPC ........ G06N 99/002; G06N 10/00; H01P 7/06; H01P 7/065; H01L 39/02
See application file for complete search history.

(56) References Cited

U.S. PATENT DOCUMENTS

| 4,344,052 A | 8/1982 | Davidson |
| 4,403,189 A | 9/1983 | Simmonds |

(Continued)

FOREIGN PATENT DOCUMENTS

| EP | 0 513 856 A2 | 11/1992 |
| EP | 2 249 173 A1 | 11/2010 |

(Continued)

OTHER PUBLICATIONS

Extended European Search Report dated Aug. 18, 2016 for Application No. EP 14778477.1.

(Continued)

*Primary Examiner* — Dean O Takaoka
*Assistant Examiner* — Alan Wong
(74) *Attorney, Agent, or Firm* — Wolf, Greenfield & Sacks, P.C.

(57) ABSTRACT

According to some aspects, a quantum mechanical system is provided, comprising a resonator having a plurality of superconducting surfaces and configured to support at least one electromagnetic oscillation mode within a three-dimensional region, wherein the plurality of superconducting surfaces include a first superconducting surface that defines a first plane, and a physical qubit comprising at least one planar component that is planar within the first plane and borders the three-dimensional region.

19 Claims, 12 Drawing Sheets

(Cross-sectional view)

(56) References Cited

U.S. PATENT DOCUMENTS

| | | | |
|---|---|---|---|
| 4,585,999 A | | 4/1986 | Hilbert et al. |
| 4,780,724 A | * | 10/1988 | Sharma ............... H01Q 9/0442 |
| | | | 333/104 |
| 4,956,312 A | | 9/1990 | Van Laarhoven |
| 5,075,655 A | | 12/1991 | Pond et al. |
| 5,105,166 A | | 4/1992 | Tsukii et al. |
| 5,186,379 A | | 2/1993 | Helber, Jr. |
| 5,254,950 A | | 10/1993 | Fan et al. |
| 5,296,457 A | | 3/1994 | Cooke et al. |
| 5,326,986 A | | 7/1994 | Miller, Jr. et al. |
| 5,493,719 A | | 2/1996 | Smith et al. |
| 5,635,834 A | | 6/1997 | Sloggett et al. |
| 5,835,512 A | | 11/1998 | Wada et al. |
| 6,549,059 B1 | | 4/2003 | Johnson |
| 6,578,018 B1 | | 6/2003 | Ulyanov |
| 6,621,374 B2 | | 9/2003 | Higgins et al. |
| 6,627,915 B1 | | 9/2003 | Ustinov et al. |
| 6,635,898 B2 | | 10/2003 | Williams et al. |
| 6,822,255 B2 | | 11/2004 | Tzalenchuk et al. |
| 6,838,694 B2 | | 1/2005 | Esteve et al. |
| 6,900,454 B2 | | 5/2005 | Blais et al. |
| 6,911,664 B2 | | 6/2005 | Il'ichev et al. |
| 6,943,368 B2 | | 9/2005 | Amin et al. |
| 7,042,005 B2 | | 5/2006 | Il'ichev et al. |
| 7,129,869 B2 | | 10/2006 | Furuta et al. |
| 7,253,654 B2 | | 8/2007 | Amin |
| 7,307,275 B2 | | 12/2007 | Lidar et al. |
| 7,364,923 B2 | | 4/2008 | Lidar et al. |
| 7,369,093 B2 | | 5/2008 | Oppenländer et al. |
| 7,533,068 B2 | | 5/2009 | Maassen van den Brink et al. |
| 7,724,083 B2 | | 5/2010 | Herring et al. |
| 7,800,395 B2 | | 9/2010 | Johnson et al. |
| 7,876,248 B2 | | 1/2011 | Berkley et al. |
| 7,899,092 B2 | | 3/2011 | Malinovsky |
| 7,932,515 B2 | | 4/2011 | Bunyk |
| 8,032,474 B2 | | 10/2011 | Macready et al. |
| 8,106,717 B2 | | 1/2012 | Ichimura et al. |
| 8,111,083 B1 | | 2/2012 | Pesetski et al. |
| 8,138,784 B2 | | 3/2012 | Przybysz et al. |
| 8,416,109 B2 | | 4/2013 | Kirichenko |
| 8,514,478 B1 | | 8/2013 | Spence |
| 8,525,619 B1 | | 9/2013 | Olsson et al. |
| 8,600,200 B1 | | 12/2013 | Rakich et al. |
| 8,642,998 B2 | | 2/2014 | Gambetta et al. |
| 8,841,764 B2 | * | 9/2014 | Poletto ................... H01L 39/04 |
| | | | 257/712 |
| 9,350,460 B2 | * | 5/2016 | Paik ........................ H04B 10/70 |
| 9,379,303 B2 | | 6/2016 | Gambetta et al. |
| 9,503,063 B1 | | 11/2016 | Abraham et al. |
| 9,836,699 B1 | | 12/2017 | Rigetti et al. |
| 9,892,365 B2 | | 2/2018 | Rigetti et al. |
| 2001/0025012 A1 | | 9/2001 | Tarutani et al. |
| 2002/0188578 A1 | | 12/2002 | Amin et al. |
| 2003/0136973 A1 | | 7/2003 | Ogawa et al. |
| 2003/0193097 A1 | | 10/2003 | Il'ichev et al. |
| 2004/0059760 A1 | | 3/2004 | Ageishi et al. |
| 2004/0140537 A1 | | 7/2004 | Il'ichev et al. |
| 2005/0117836 A1 | | 6/2005 | Franson et al. |
| 2005/0134377 A1 | | 6/2005 | Dent |
| 2005/0224784 A1 | | 10/2005 | Amin et al. |
| 2006/0179029 A1 | | 8/2006 | Vala et al. |
| 2007/0215862 A1 | | 9/2007 | Beausoleil et al. |
| 2007/0296953 A1 | | 12/2007 | Allen et al. |
| 2008/0100175 A1 | | 5/2008 | Clark |
| 2008/0274898 A1 | | 11/2008 | Johnson et al. |
| 2009/0028340 A1 | | 1/2009 | Trifonov |
| 2009/0033369 A1 | | 2/2009 | Baumgardner et al. |
| 2009/0074355 A1 | | 3/2009 | Beausoleil et al. |
| 2009/0153180 A1 | | 6/2009 | Herring et al. |
| 2009/0232191 A1 | | 9/2009 | Gupta et al. |
| 2009/0258787 A1 | | 10/2009 | Wilkie et al. |
| 2009/0289638 A1 | | 11/2009 | Farinelli et al. |
| 2010/0241780 A1 | | 9/2010 | Friesen |
| 2010/0246152 A1 | | 9/2010 | Lin et al. |
| 2011/0060710 A1 | | 3/2011 | Amin |
| 2011/0079889 A1 | | 4/2011 | Baillin |
| 2012/0074509 A1 | | 3/2012 | Berg et al. |
| 2012/0319085 A1 | | 12/2012 | Gambetta et al. |
| 2012/0319684 A1 | | 12/2012 | Gambetta et al. |
| 2012/0326130 A1 | | 12/2012 | Maekawa et al. |
| 2012/0326720 A1 | | 12/2012 | Gambetta et al. |
| 2013/0043945 A1 | | 2/2013 | McDermott et al. |
| 2013/0107352 A1 | | 5/2013 | Santori et al. |
| 2013/0196855 A1 | * | 8/2013 | Poletto ................... H01L 39/04 |
| | | | 505/170 |
| 2014/0112107 A1 | | 4/2014 | Guo et al. |
| 2014/0314419 A1 | * | 10/2014 | Paik ........................ H04B 10/70 |
| | | | 398/115 |
| 2015/0357550 A1 | | 12/2015 | Schoelkopf, III et al. |
| 2015/0372217 A1 | | 12/2015 | Schoelkopf et al. |
| 2016/0148112 A1 | | 5/2016 | Kwon |

FOREIGN PATENT DOCUMENTS

| | | |
|---|---|---|
| EP | 2 264 799 A1 | 12/2010 |
| GB | 1 370 647 A | 10/1974 |
| JP | 61-082449 A | 4/1986 |
| JP | 02-194638 A | 8/1990 |
| RU | 2 106 717 C1 | 3/1998 |
| RU | 2 212 671 C1 | 9/2003 |
| RU | 2010 124 198 A | 12/2011 |
| WO | WO 2012/173711 A1 | 12/2012 |
| WO | WO 2012/173712 A1 | 12/2012 |

OTHER PUBLICATIONS

International Search Report and Written Opinion dated Nov. 13, 2014 for Application No. PCT/US2014/012073.

International Preliminary Report on Patentability dated Jul. 30, 2015 for Application No. PCT/US2014/012073.

Extended European Search Report dated Aug. 12, 2016 for Application No. EP 14783459.2.

International Search Report and Written Opinion dated Nov. 13, 2014 for Application No. PCT/US2014/012080.

International Preliminary Report on Patentability dated Jul. 30, 2015 for Application No. PCT/US2014/012080.

Abdo et al., Full coherent frequency conversion between two propagating microwave modes. Phys Rev Lett. Apr. 26, 2013;110:173902.1-5. doi: 10.1103/PhysRevLett.110.173902.

Abdo et al., Josephson directional amplifier for quantum measurement of superconducting circuits. Phys Rev Lett. Apr. 25, 2014;112:167701.1-5. doi: 10.1103/PhysRevLett.112.167701.

Abdo et al., Nondegenerate three-wave mixing with the Josephson ring modulator. Phys Rev B. Jan. 16, 2013;87(1):014508.1-18. doi: 10.1103/PhysRevB.87.014508.

Albert et al., Holonomic quantum computing with cat-codes. Apr. 10, 2015. arXiv:1503.00194v2. 5 pages.

Albert et al., Symmetries and conserved quantities in Lindblad master equations. Phys Rev A. Feb. 2014;89(2):022118. arXiv:1310.1523v2. 15 pages.

Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.

Burgarth et al., Non-Abelian phases from quantum Zeno dynamics. Phys Rev A. Oct. 9, 2013;88:042107.1-5. doi: 10.1103/PhysRevA.88.042107.

Campagne-Ibarcq et al., Persistent control of a superconducting qubit by stroboscopic measurement feedback. Phys Rev X. 2013;3:1-7. arXiv:1301.6095v2.

Carollo et al., Coherent Quantum Evolution via Reservoir Driven Holonomies. Phys Rev Lett. Jan. 18, 2006;96;020403. arXiv:quant-ph/0507229v2. 4 pages.

Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.

Castellanos-Beltran et al., Amplification and squeezing of quantum noise with a tunable Josephson metamaterial. Nat Phys. Dec. 2008;4(12):928-31.

(56) References Cited

OTHER PUBLICATIONS

Chaturvedi et al., Berry's phase for coherent states. J Phys A: Math Gen. 1987;20(16):L1071-5.

Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.

De Ponte et al., Relaxation- and decoherence-free subspaces in networks of weakly and strongly coupled resonators. Ann Phys. Mar. 12, 2007;322:2077-84.

Devoret et al., Superconducting Circuits for Quantum Information: An Outlook. Science. Mar. 8, 2013;339:1169-74. doi: 10.1126/science.1231930.

Duan et al., Preserving Coherence in Quantum Computation by Pairing Quantum Bits. Phys Rev Lett. Sep. 8, 1997;79(10-8):1953-6.

Eichler et al., Controlling the dynamic range of a Josephson parametric amplifier. EPJ Quantum Tech. Jan. 29, 2014;1(2). doi:10.1140/epjqt2. 19 pages.

Facchi et al., Quantum Zeno Subspaces. Phys Rev Lett. Aug. 19, 2002;89(8):080401.1-4.

Heeres et al., Cavity State Manipulation Using Photon-Number Selective Phase Gates. Phys Rev Lett. Sep. 25, 2015;115:137002.1-5. doi: 10.1103/PhysRevLett.115.137002.

Hofheinz et al., Synthesizing arbitrary quantum states in a superconducting resonator. Nature. May 28, 2009;459:546-9. doi:10.1038/nature08005. Supplementary Information. 5 pages.

Houck et al., Life after charge noise: recent results with transmon qubits. Quantum Info Process. Feb. 11, 2009;8(2-3):105-15.

Hover et al., High fidelity qubit readout with the superconducting lowinductance undulatory galvanometer microwave amplifier. Appl Phys Lett. 2014;104;152601.1-4.

Hover et al., Superconducting Low-inductance Undulatory Galvanometer Microwave Amplifier. Appl Phys Lett. Feb. 7, 2012;100:063503.1-3.

Johnson et al., Dispersive readout of a flux qubit at the single-photon level. Phys Rev B. 2011;84:220503. arXiv:1109.2858v2. 5 pages.

Kamal et al., Gain, directionality, and noise in microwave SQUID amplifiers: Input-output approach. Phys Rev B. 2012;86:144510.1-12. doi: 10.1103/PhysRevB.86.144510.

Kerckhoff et al., On-chip superconducting microwave circulator from synthetic rotation. Phys Rev Appl. 2015;4:034002. arXiv:1502.06041. Submitted Feb. 21, 2015. 13 pages.

Kirchmair et al., Observation of quantum state collapse and revival due to the single-photon Kerr effect. Nature. Mar. 14, 2013;495:205-9. doi:10.1038/nature11902.

Knill et al., Theory of Quantum Error Correction for General Noise. Phys Rev Lett. Mar. 13, 2000;84(11):2525-8. arXiv:quant-ph/9908066v1. 6 pages.

Koch et al., Time-reversal symmetry breaking in circuit-QED based photon lattices. arXiv:1006.0762v2. Oct. 11, 2010. 19 pages.

Krastanov et al., Universal Control of an Oscillator with Dispersive Coupling to a Qubit. Phys Rev A. 2015;92:040303. arXiv:1502.08015. Submitted Feb. 27, 2015. 5 pages.

Leghtas et al., Confining the state of light to a quantum manifold by engineered two-photon loss. Dec. 16, 2014. arXiv:1412.4633v1. 29 pages.

Lidar et al., Decoherence-Free Subspaces for Quantum Computation. Phys Rev Lett. Sep. 21, 1998;81(12):2594-7. arXiv:quant-ph/9807004v2. 4 pages.

Lindblad, On the generators of quantum dynamical semigroups. Commun Math Phys. 1976;48(2):119-30.

Minev et al., Planar Superconducting Whispering Gallery Mode Resonators. Appl Phys Lett. Oct. 3, 2013;103:142604.1-3. doi: 10.1063/1.4824201.

Mirrahimi et al., Dynamically protected cat-qubits: a new paradigm for universal quantum computation. New J Phys. Apr. 22, 2014;16:045014. 31 pages.

Mousolou et al., Universal non-adiabatic holonomic gates in quantum dots and single-molecule magnets. New J Phys. Jan. 17, 2014;16:013029. 10 pages.

Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.

Narla et al., Wireless Josephson amplifier. Appl Phys Lett. 2014;104:232605. doi: 10.1063/1.4883373. 6 pages.

O'Brien et al., Resonant Phase Matching of Josephson Junction Traveling Wave Parametric Amplifiers. Phys Rev Lett. Oct. 10, 2014;113:157001.1-5.

Oreshkov et al., Adiabatic Markovian Dynamics. Phys Rev Lett. Jul. 30, 2010;105(5):050503. arXiv:1002.2219v4. 7 pages.

Oreshkov et al., Fault-Tolerant Holonomic Quantum Computation. Phys Rev Lett. Feb. 20, 2009;102:070502.1-4.

Oreshkov, Holonomic Quantum Computation in Subsystems. Phys Rev Lett. Aug. 28, 2009;103(9):090502. arXiv:0905.1249v3. 5 pages.

Pachos et al., Decoherence-free dynamical and geometrical entangling phase gates. Phys Rev A. 2004;69:033817. arXiv:quant-ph/0309180v3. 10 pages.

Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.

Paz-Silva et al., Zeno Effect for Quantum Computation and Control. Phys Rev Lett. Feb. 24, 2012;108(8):080501. arXiv:1104.5507v2. 7 pages.

Pillet et al., Optimal design for the Josephson mixer. Mar. 30, 2015. arXiv:1503.08185v1. 5 pages.

Platenberg, Coupled superconducting flux qubits. Delft University of Technology. Thesis. 2007. 153 pages.

Ranzani et al., Graph-based analysis of nonreciprocity in coupled-mode systems. New J Phys. Oct. 15, 2014;17:023024. arXiv 2014;1406.4922v2. 21 pages.

Ristè et al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.

Roch et al., Observation of measurement-induced entanglement and quantum trajectories of remote superconducting qubits. Phys Rev Lett. May 2, 2014;112:170501.1-5.

Roch et al., Widely Tunable, Nondegenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.

Sarandy et al., Abelian and non-Abelian geometric phases in adiabatic open quantum systems. Phys Rev A. Jun. 2006;73(6):062101. arXiv:quant-ph/0507012v3. 10 pages.

Schackert et al., Phase-preserving amplification near the quantum limit with a Josephson ring modulator. Nature. May 2010;465(7294):64-8. arXiv:0912.3407v1. 20 pages.

Schindler et al., Quantum simulation of dynamical maps with trapped ions. Nature Phys. May 19, 2013;9:361-7. arXiv:1212.2418v1. 28 pages.

Siddiqi et al., An RF-Driven Josephson Bifurcation Amplifier for Quantum Measurement. Phys Rev Lett. Nov. 10, 2004;93:207002. arXiv:cond-mat/0312623v1. 4 pages.

Sjöqvist, Trends: A new phase in quantum computation. Phys. 2008;1:35. doi: 10.1103/Physics.1.35. 6 pages.

Spietz et al., Input Impedance and Gain of a Gigahertz Amplifier Using a dc Superconducting Quantum Interference Device in a Quarter Wave Resonator. Appl Phys Lett. 2008;93:082506. arXiv:0806.2853v1. 4 pages.

Vijay et al., Observation of Quantum Jumps in a Superconducting Artificial Atom. Phys Rev Lett. Mar. 18, 2011;106(11):110502.1-4.

Wang, Memristors and Superconducting Quantum Interference Filters in RF Systems. Department of Electrical and Computer Engineering, Duke University. Thesis. Aug. 18, 2014. 119 pages.

Wendin et al., Superconducting quantum circuits, qubits and computing. arXiv:cond-mat/0508729v1. Aug. 30, 2005. 60 pages.

(56) References Cited

OTHER PUBLICATIONS

Wu et al., Time-dependent decoherence-free subspace. J Phys A: Math. Theor. Sep. 19, 2012;45(40):405305. arXiv:1205.1298v2. 7 pages.

Xu et al., Non-Adiabatic Holonomic Quantum Computation in Decoherence-Free Subspaces. Phys Rev Lett. Oct. 24, 2012;109(17):170501. arXiv:1210.6782v1. 4 pages.

Xu et al., Universal Nonadiabatic Geometric Gates in Two-Qubit Decoherence-Free Subspaces. Sci Rep. Oct. 29, 2014;4:6814. doi: 10.1038/srep06814. 5 pages.

Yaakobi et al., Parametric amplification in Josephson junction embedded transmission lines. Phys Rev B. Apr. 1, 2013;87:144301. 1-9. doi: 10.1103/PhysRevB.87.144301.

Zanardi et al., Coherent quantum dynamics in steady-state manifolds of strongly dissipative systems. Phys Rev Lett. Dec. 17, 2014;113:240406. arXiv:1404.4673. 6 pages.

Zanardi et al., Geometry, robustness, and emerging unitarity in dissipation-projected dynamics. Phys Rev A. 2015;91:052324. arXiv:1412.6198. 8 pages.

Zanardi et al., Holonomic Quantum Computation. Phys Lett A. Nov. 15, 1999;264:94-9. 5 pages.

Zanardi et al., Noiseless Quantum Codes. Phys Rev Lett. Oct. 27, 1997;79(17):3306-9. arXiv:quant-ph/9705044v2. 4 pages.

Zanardi, Stabilizing Quantum Information. Phys Rev A. Dec. 5, 2000;63(1):012301. arXiv:quant-ph/9910016v2. 5 pages.

Zanardi, Virtual Quantum Subsystems. Phys Rev Lett. Aug. 13, 2001;87(7):077901. arXiv:quant-ph/0103030v2. 4 pages.

Zhang et al., Physical implementation of holonomic quantum computation in decoherence-free subspaces with trapped ions. Phys Rev A. 2006;74:034302. arXiv:quant-ph/0608068v1. 4 pages.

Zheng, Dissipation-induced geometric phase for an atom in captivity QED. Phys Rev A. May 10, 2012;85(5):052106. arXiv:1205.0984v2. 7 pages.

Zheng, Open-system geometric phase based on system-reservoir joint state evolution. Phys Rev A. Jun. 27, 2014;89:062118. arXiv:1405.1227v1. 8 pages.

Zhu et al., Geometric quantum gates robust against stochastic control errors. Phys Rev A. Aug. 15, 2005;72(2):020301. arXiv:quant-ph/0407177v1. 4 pages.

International Search Report and Written Opinion for International Application No. PCT/US2014/012073 dated Nov. 13, 2014.

Extended European Search Report for European Application No. EP 14778477.1 dated Aug. 18, 2016.

International Preliminary Report on Patentability for International Application No. PCT/US2014/012073 dated Jul. 30, 2015.

Extended European Search Report for European Application No. EP 14783459.2 dated Aug. 12, 2016.

International Search Report and Written Opinion International Application No. PCT/US2014/012080 dated Nov. 13, 2014.

International Preliminary Report on Patentability for International Application No. PCT/US2014/012080 dated Jul. 30, 2015.

Extended European Search Report for European Application No. EP 16756456.6 dated Oct. 19, 2018.

International Search Report and Written Opinion for International Application No. PCT/US2016/019801 dated May 23, 2016.

International Search Report and Written Opinion for International Application No. PCT/US2018/020190 dated May 30, 2018.

International Search Report and Written Opinion for International Application No. PCT/US2018/020197 dated May 29, 2018.

Abdo et al., Directional amplification with a Josephson circuit. Phys Rev X. 2013;3:031001.

Abdo et al., Josephson amplifier for qubit readout. Appl Phys Lett. 2011;99(16):162506. doi: 10.1063/1.3653473.

Bell et al., Quantum superinductor with tunable nonlinearity. Phys Rev Lett. 2012;109:137003. doi:10.1103/PhysRevLett.109.137003.

Bergeal et al., Phase-preserving amplification near the quantum limit with a Josephson ring modulator. Nature. May 6, 2010;465(7294):64-8. doi: 10.1038/nature09035.

Brown et al., Microwave and millimeter-wave high-Q micromachined resonators. Int J RF and Microwave CAE. 1999;9:326-37.

Campagne-Ibarcq et al., Deterministic remote entanglement of superconducting circuits through microwave two-photon transitions. Phys Rev Lett. May 16, 2018;120:200501.

Catelani et al., Decoherence of superconducting qubits caused by quasiparticle tunneling. Phys Rev B. 2012;86:184514.

Catelani et al., Quasiparticle Relaxation of Superconducting Qubits in the Presence of Flux. Phys Rev Lett. 2011;106:077002.

Catelani et al., Relaxation and frequency shifts induced by quasiparticles in superconducting qubits. Phys Rev. 2011;B84:064517.

Chow et al., Detecting highly entangled states with a joint qubit readout. Phys Rev A. 2010;81:062325.

Chow et al., Optimized driving of superconducting artificial atoms for improved single-qubit gates. Phys Rev. 2010;A82:040305.

Chow et al., Universal quantum gate set approaching fault-tolerant thresholds with superconducting qubits. Phys Rev Lett. 2012;109:060501.

Chu et al., Quantum acoustics with superconducting qubits. Science. 2017;358:199-202.

Chu et al., Suspending superconducting qubits by silicon micromachining. Appl Phys Lett. 2016;109:112601.

Clarke et al., Superconducting quantum bits. Nature. Jun. 19, 2008;453(7198):1031-42. doi: 10.1038/nature07128.

Devoret et al., Implementing qubits with superconducting integrated circuits. Experimental Aspects of Quantum Computing. 2005:163-203.

Dicarlo et al., Demonstration of two-qubit algorithms with a superconducting quantum processor. Nature. Jul. 9, 2009;460(7252):240-4. doi: 10.1038/nature08121. Epub Jun. 28, 2009.

Dicarlo et al., Preparation and measurement of three-qubit entanglement in a superconducting circuit. Nature. Sep. 30, 2010;467(7315):574-8. doi: 10.1038/nature09416.

Elliott et al., Enhancement and state tomography of a squeezed vacuum with circuit quantum electrodynamics. Phys Rev A. 2015;92:013826.

Frattini et al., 3-wave mixing Josephson dipole element. Appl Phys Lett. 2017;110:222603.

Gao et al., Programmable interference between two microwave quantum memories. Phys Rev X. 2018;(8):021073.

Geerlings et al., Improving the Quality Factor of Microwave Compact Resonators by Optimizing their Geometrical Parameters. App Phys Lett. 2012;100:192601.

Ginossar et al., Nonlinear oscillators and high fidelity qubit state measurement in circuit quantum electrodynamics. Fluctuating Nonlinear Oscillators. Nanomechanics to quantum superconducting circuits. Oxford University Press. 2012. Chapter 8:198-216.

Girvin et al., Circuit QED and engineering charge-based superconducting qubits. Physica Scripta. 2009;T137:014012.

Hofheinz et al., Generation of Fock states in a superconducting quantum circuit. Nature. Jul. 17, 2008;454(7202):310-4. doi: 10.1038/nature07136.

Houck et al., Controlling the spontaneous emission of a superconducting transmon qubit. Phys Rev Lett. 2008;101:080502.

Johnson et al., Quantum non-demolition detection of single microwave photons in a circuit. Nature. 2010;6:663-667.

Kamal et al., Noiseless nonreciprocity in a parametric active device. Nature Physics. 2011;7:311-15.

Kamal et al., Signal-to-pump back action and self-oscillation in double pump Josephson parametric amplifier. Phys Rev B. 2009;79:184301.

Kerman, Metastable superconducting qubit. Phys Rev Lett. 2010;104:027002.

Kirchmair et al., Observation of quantum state collapse and revival due to the single-photon Kerr effect. Nature. Mar. 14, 2013;495(7440):205-9. doi: 10.1038/nature11902.

Koch et al., Charge-insensitive qubit design derived from the Cooper pair box. Phys Rev A. 2007;76:042319.

Koch et al., Charging effects in the inductively shunted Josephson junction. Phys Rev Lett. 2009;103:217004.

Kuhr et al., Ultrahigh finesse Fabry-Perot superconducting resonator. Appl Phys Lett. 2007;90:164101.

Lee et al. Chemically etched ultrahigh-Q wedge-resonator on a silicon chip. Nature Photonics. 2012;6:369-73.

(56) References Cited

OTHER PUBLICATIONS

Leghtas et al., Deterministric protocol for mapping a qubit to coherent state superpositions in a cavity. Phys Rev A. 2013;87:042315.
Leghtas et al., Hardware-efficient autonomous quantum memory protection. Phys Rev Lett. 2013;111:120501.
Leghtas et al., Quantum engineering. Confining the state of light to a quantum manifold by engineered two-photon loss. Science. Feb. 20, 2015;347(6224):853-7. doi: 10.1126/science.aaa2085.
Lucero et al., Computing prime factors with a Josephson phase qubit quantum processor. Nature Phys. 2012;8:719-723.
Manucharyan et al., Fluxonium: single Cooper-pair circuit free of charge offsets. Science. 2009;326:113-6.
Martinis et al., Decoherence in Josephson qubits from dielectric loss. Phys. Rev. Lett. Nov. 16, 2005;95(21):210503.
Masluk et al., Microwave characterization of Josephson junction arrays: Implementing a low loss superinductance. Phys Rev Lett. 2012;109:137002.
Murch et al., Quantum state sensitivity of an autoresonant superconducting circuit. Phys Rev B. 2012;86:220503.
Narla et al., Robust concurrent remote entanglement between two superconducting qubits. Phys Rev X. 2016;6:031036.
Nigg et al., Black-box superconducting circuit quantization. Phys Rev Lett. 2012;108:240502.
Nigg et al., Stabilizer quantum error correction toolbox for superconducting qubits. Phys Rev Lett. 2013;110:243604.
Ofek et al., Extending the lifetime of a quantum bit with error correction in superconducting circuits. Nature. 2016;536:441-445.
Pfaff et al., Controlled release of multiphoton quantum states from a microwave cavity memory. Nature Phys. 2017;13(9):882-887.
Reagor et al., Quantum Memory with Millisecond Coherence in Circuit QED. Phys Rev B. 2016;94:014506.
Reagor et al., Reaching 10 ms single photon lifetimes for superconducting aluminum cavities. Appl Phys Lett. 2013;102:192604.
Reed et al., Fast reset and suppressing spontaneous emission of a superconducting qubit. App. Phys. Lett. 2010;96:203110.
Reed et al., High-Fidelity readout in circuit quantum electrodynamics using the Jaynes-Cummings nonlinearity. Phys Rev Lett. 2010;105:173601.
Reed et al., Realization of three-qubit quantum error correction with superconducting circuits. Nature. 2012;482:382.
Rigetti et al., Superconducting qubit in waveguide cavity with coherence time approaching 0.1ms. Phys Rev B. 2012;86,100506.
Ristè et al., Millisecond charge-parity fluctuations and induced decoherence in a superconducting transmon qubit. Nat Commun. 2013;4:1913. doi: 10.1038/ncomms2936.
Rosenblum et al., Fault-tolerant detection of a quantum error. Science. Jul. 20, 2018;361(6399):266-70.
Sank et al., Measurement-induced state transitions in a superconducting qubit: beyond the rotating wave approximation. Phys Rev Lett. 2016;117:190503.
Sayrin et al., Real-time quantum feedback prepares and stabilizes photon number states. Nature. Aug. 31, 2011;477(7362):73-7. doi: 10.1038/nature10376.
Schoelkopf et al., Wiring up quantum systems. Nature. Feb. 7, 2008;451(7179):664-9. doi: 10.1038/451664a.
Schuster et al., Cavity QED in a molecular ion trap. Phys Rev A. 2011;83:012311.
Schuster et al., Resolving photon number states in a superconducting circuit. Nature. Feb. 1, 2007;445(7127):515-8.
Sears et al., Photon shot noise dephasing in the strong-dispersive limit of circuit QED. Phys Rev B. 2012;86:180504.
Steffen et al., High-coherence hybrid superconducting qubit. Phys Rev Lett. 2010;105:100502.
Sun et al., Measurements of quasiparticle tunneling dynamics in a band-gap-engineered transmon qubit. Phys Rev Lett. 2012;108:230509.
Verney et al., Structural instability of driven Josephson circuits prevented by an inductive shunt. Phys Rev Appl. Feb. 1, 2019;11:024003.
Vijay et al., Quantum feedback control of a superconducting qubit: Persistent: Rabi oscillations. Nature. 2012;490:77-80.
Vijay et al., Stabilizing Rabi oscillations in a superconducting qubit using quantum feedback. Nature. Oct. 4, 2012;490(7418):77-80. doi: 10.1038/nature11505.
Vion et al., Manipulating the quantum state of an electrical circuit. Science. May 3, 2002;296(5569):886-9.
Wallraff et al., Approaching unit visibility for control of a superconducting qubit with dispersive readout. Phys Rev Lett. 2005;95:060501-060504.
Wallraff et al., Strong coupling of a single photon to a superconducting qubit using circuit quantum electrodynamics. Nature. Sep. 9, 2004;431(7005):162-7.
Wang et al., A Schrödinger cat living in two boxes. Science. May 27, 2016;352(6289):1087-91. doi: 10.1126/science.aaf2941.
Wang et al., Surface participation and dielectric loss in superconducting qubits. Appl Phys Lett. 2015;107:162601.
You et al., Superconducting qubits and quantum information. Physics Today. 2005;58(11):42.
Zmuidzinas, Superconducting microresonators: physics and applications. Annu Rev Condens Matter Phys. 2012;3:169-214.

\* cited by examiner

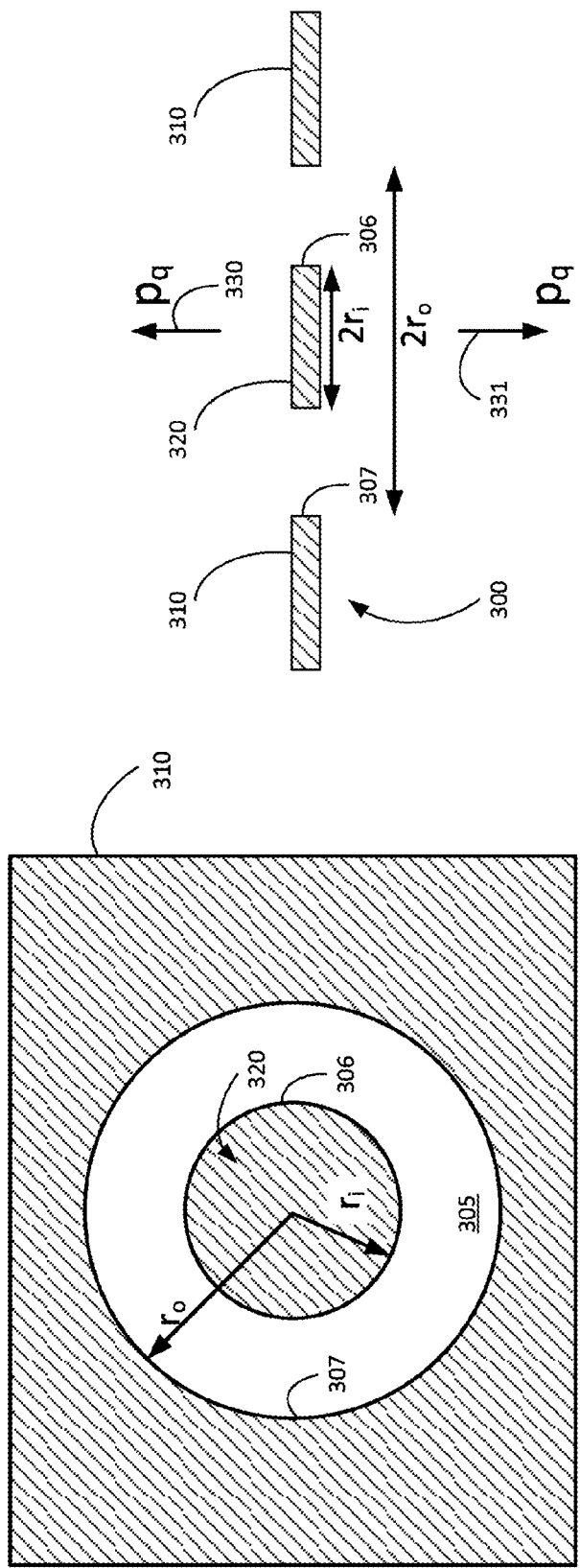
FIG. 3B (Cross-sectional view)
FIG. 3A (Top view)

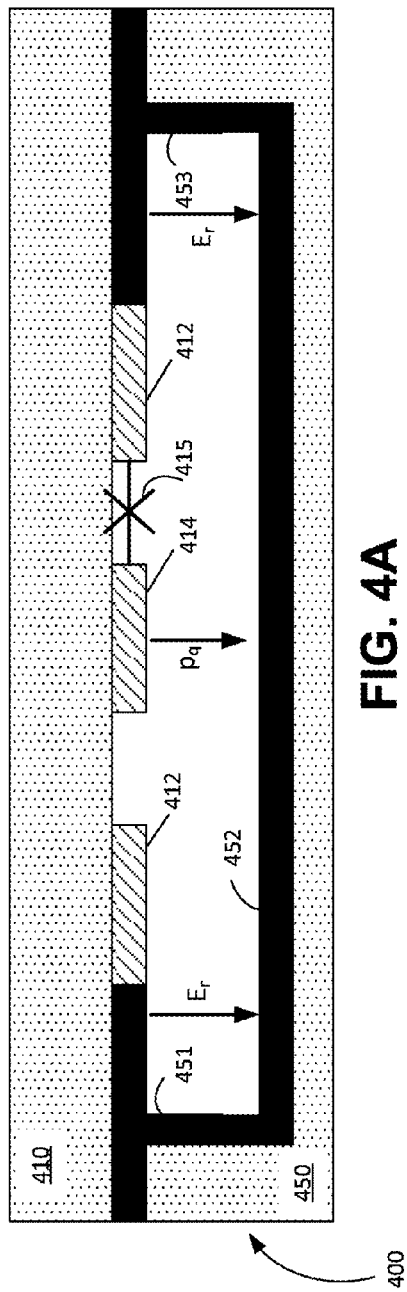
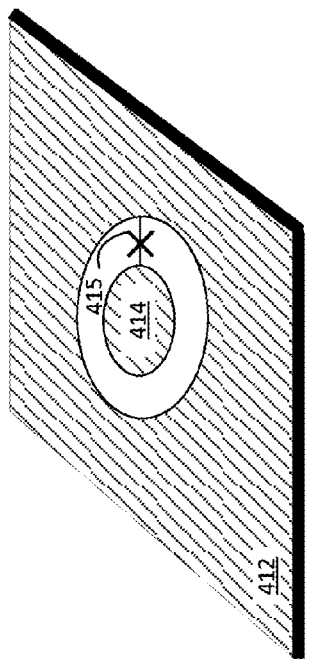
FIG. 4A
(Cross-sectional view)
FIG. 4B
(Perspective view)

(Cross-sectional view)

(Elevation View)

(Cross-Sectional View)

(Elevation View)

(Top View)

(Top View)

(Top View)

TECHNIQUES FOR COUPLING PLANAR QUBITS TO NON-PLANAR RESONATORS AND RELATED SYSTEMS AND METHODS

CROSS REFERENCE TO RELATED APPLICATIONS

This application is a national phase filing under 35 U.S.C. § 371 of International Application No. PCT/US2016/019801, filed on Feb. 26, 2016, which claims priority to U.S. Provisional Patent Application No. 62/126,183, filed on Feb. 27, 2015, each of which are incorporated herein by reference to the maximum extent allowable.

STATEMENT REGARDING FEDERALLY-SPONSORED RESEARCH AND DEVELOPMENT

This invention was made with U.S. Government support under Grant No. W911NF-14-1-0011 awarded by the U.S. Army Research Office. The U.S. Government may have certain rights in this invention.

FIELD

The present application relates generally to quantum information processing. More specifically, the present application relates to coupling a planar quantum system to a non-planar resonator or resonant structure.

BACKGROUND

Quantum information processing uses quantum mechanical phenomena, such as energy quantization, superposition, and entanglement, to encode and process information in a way not utilized by conventional information processing. For example, certain computational problems may be solved more efficiently using quantum computation rather than conventional classical computation. However, to become a viable computational option, it may be necessary to precisely control a large number of quantum bits, known as "qubits," and to control interactions between these qubits. In particular, qubits may ideally have long coherence times, be able to be individually manipulated, be able to interact with one or more other qubits to implement multi-qubit gates, be able to be initialized and measured efficiently, and be scalable so that a quantum computer can include large numbers of qubits.

A qubit may be formed from any physical quantum mechanical system with at least two orthogonal states. The two states of the system used to encode information are referred to as the "computational basis." For example, photon polarization, electron spin, and nuclear spin are all two-level systems that may encode information and may therefore each be used as a qubit for quantum information processing. Different physical implementations of qubits have different advantages and disadvantages. For example, photon polarization benefits from long coherence times and simple single qubit manipulation, but suffers from the inability to create simple multi-qubit gates.

Different types of superconducting qubits using Josephson junctions have been proposed, including "phase qubits," where the computational basis is the quantized energy states of Cooper pairs in a Josephson Junction; "flux qubits," where the computational basis is the direction of circulating current flow in a superconducting loop; and "charge qubits," where the computational basis is the presence or absence of a Cooper pair on a superconducting island. Superconducting qubits are an advantageous choice of qubit because the coupling between two qubits is strong, making two-qubit gates relatively simple to implement, and superconducting qubits are scalable because they are mesoscopic components that may be formed using conventional electronic circuitry techniques.

SUMMARY

Some aspects are directed to quantum mechanical system, comprising a resonator having a plurality of superconducting surfaces and configured to support at least one electromagnetic oscillation mode within a three-dimensional region, wherein the plurality of superconducting surfaces include a first superconducting surface that defines a first plane, and a physical qubit comprising at least one planar component that is planar within the first plane and borders the three-dimensional region.

According to some embodiments, the at least one planar component includes at least one Josephson element.

According to some embodiments, the at least one planar component includes a superconducting patch antenna.

According to some embodiments, the superconducting patch antenna comprises a patch with a circular shape.

According to some embodiments, the superconducting patch antenna comprises a patch with a rectangular shape.

According to some embodiments, a superconducting patch of the superconducting patch antenna is connected to the first superconducting surface via at least one Josephson element.

According to some embodiments, the resonator is a three dimensional cavity resonator.

According to some embodiments, the resonator is a whispering gallery mode resonator.

According to some embodiments, the whispering gallery mode resonator includes the first superconducting surface and a second superconducting surface parallel to the first superconducting surface, and wherein the first superconducting surface is separated from the second superconducting surface by a first distance.

According to some embodiments, the whispering gallery mode resonator supports at least two electromagnetic oscillation modes.

According to some embodiments, the at least two electromagnetic oscillation modes are differential modes.

According to some embodiments, a first electromagnetic oscillation mode of the at least two electromagnetic oscillation modes is a parallel mode.

According to some embodiments, a second electromagnetic oscillation mode of the at least two electromagnetic oscillation modes is a perpendicular mode.

According to some embodiments, the first superconducting surface is a first ring-like structure and the second superconducting surface is a second ring-like structure.

According to some embodiments, the first ring-like structure is circularly asymmetric such that a first width of the first ring-like structure in the first plane at a first location is less than a second width of the first ring-like structure in the first plane at a second location, different from the first location.

According to some embodiments, the quantum mechanical system comprises a plurality of resonators.

According to some embodiments, a first resonator of the a plurality of resonators is a readout cavity.

According to some embodiments, a second resonator of the a plurality of resonators is a storage cavity.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 3A is a top view of a patch antenna, according to some embodiments;

FIG. 3B is a cross-sectional view of a patch antenna, according to some embodiments;

FIG. 4A is a cross-sectional view of a quantum device comprising a three-dimensional cavity resonator, according to some embodiments;

FIG. 4B is a perspective view of a qubit and one superconducting portion of a three-dimensional cavity resonator, according to some embodiments;

DETAILED DESCRIPTION

As discussed above, superconducting qubits are an advantageous choice of qubit in building a quantum computation device. In particular, superconducting qubits can be fabricated using standard two-dimensional fabrication techniques such as lithography, making them scalable. On the other hand, superconducting qubits suffer from having shorter coherence times than other devices for storing quantum information. As such, superconducting qubits are often coupled to interact with electromagnetic radiation, such as standing waves within a resonant cavity or other oscillator, to form a three-dimensional circuit. Since a resonator typically offers much greater coherence times than a superconducting qubit, a combination of the two devices into a "logical" qubit may offer a longer coherence time.

Figure 1:
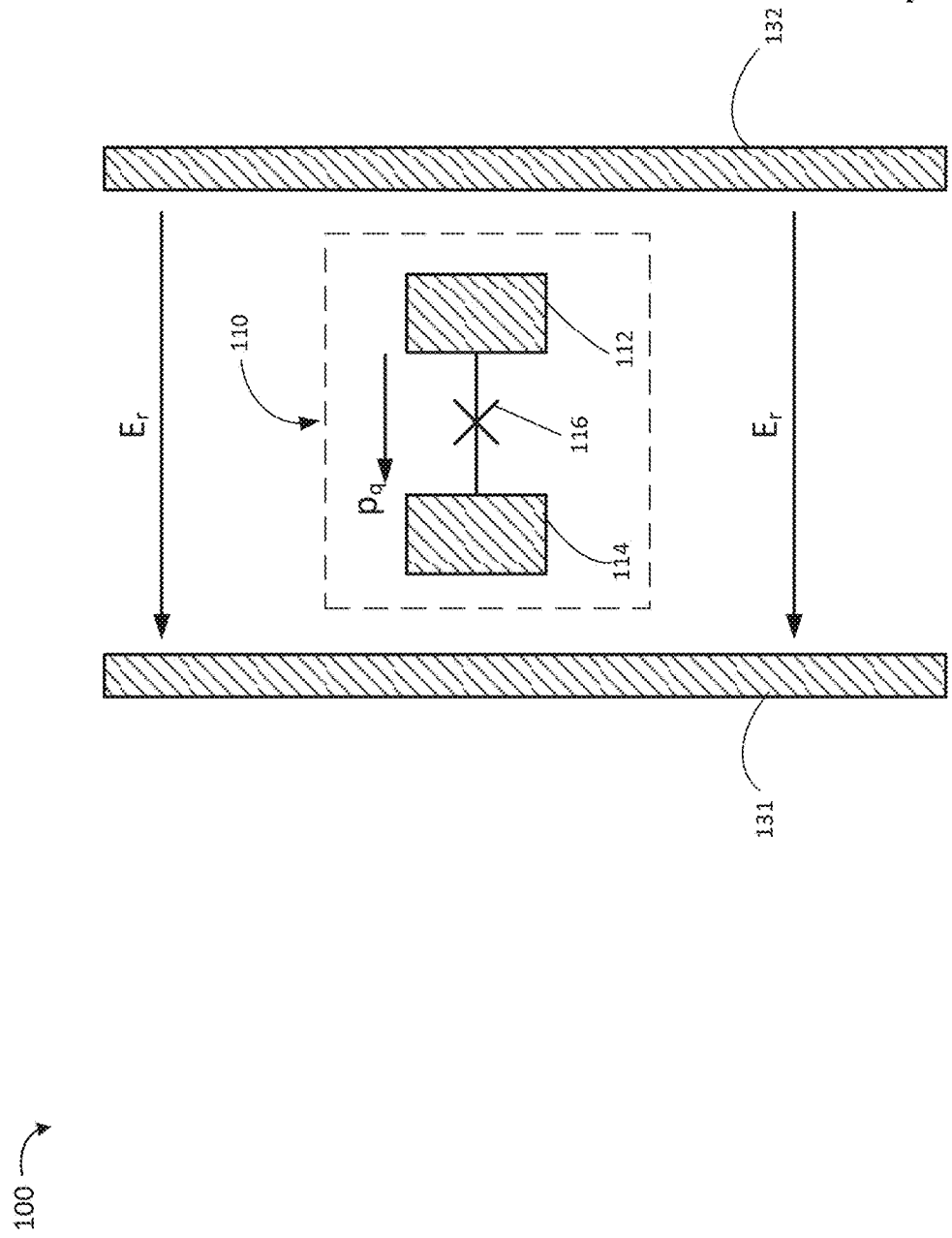
FIG. 1 illustrates a conventional quantum device.

FIG. 1 illustrates an example of a conventional quantum device 100 in which a superconducting qubit 110 is placed within a cavity resonator defined by reflectors 131 and 132. The qubit 110 includes a Josephson junction 116 (indicated as an "X" in the drawing) connected to two superconducting blocks 112 and 114 that act as a dipole antenna. The qubit 110 is a substantially two-dimensional device that resides in a single plane. A dipole moment produced by the qubit, $p_q$, lies in the plane of the qubit 110. An electric field produced by the resonator, $E_r$, is directed perpendicular to the reflectors 131 and 132 (two illustrative field lines are shown). The qubit and resonator can be coupled to one another since the electric field of the resonator and the dipole moment of the qubit are aligned.

In the illustrative device of FIG. 1, both the dipole moment of the qubit and the electric field of the resonator lie in the plane defined by the planar qubit 110. However, the resonator also produces electric fields above and/or below the plane of the qubit. These fields can be detrimental to the performance of the device because they can contribute to radiation loss and/or cross-talk between different elements of the device. Accordingly, while it is necessary that the electric field be present in the plane of the qubit and aligned with the dipole moment of the qubit, the design of FIG. 1 leads to undesired effects within the qubit.

Thus, while superconducting qubits can be fabricated using conventional techniques, they also exhibit relatively shorter coherence times. Alternatively, three-dimensional devices such as device 100 shown in FIG. 1 offer relatively longer coherence times yet cannot be so easily fabricated and can also introduce detrimental effects during operation due to unwanted interactions between the qubit and electric field of the resonator.

The inventors have recognized and appreciated that qubits may be produced that can be fabricated using conventional techniques yet also exhibit relatively longer coherence times by forming planar multilayer circuits in which a qubit located within the plane of a wall of a resonator cavity is configured to produce a dipole moment directed into the cavity. Accordingly, the qubit can be fabricated in a planar fashion with the resonator cavity, thus allowing the use of conventional fabrication techniques, whilst the qubit can be coupled to the resonator since its dipole moment is aligned with the electric field of the resonator.

Figure 2:
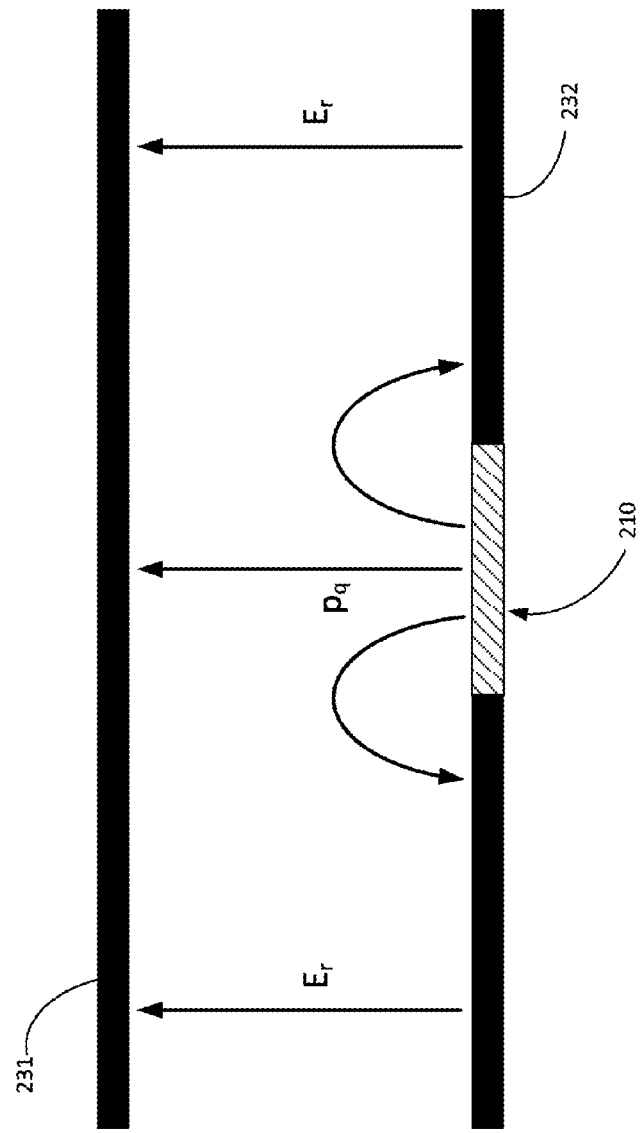
FIG. 2 illustrates a quantum device in which a planar qubit is coupled to a non-planar resonator, according to some embodiments.

FIG. 2 illustrates a quantum device in which a planar qubit is coupled to a non-planar resonator, according to some embodiments. In the example of FIG. 2, a qubit 210 is fabricated within a reflector 232 of a resonator defined by reflectors 231 and 232. As shown, the qubit 210 is configured to produce a dipole moment that, at least in one region of the resonator, is directed perpendicular to the reflector 232 and parallel to the electric field $E_r$ produced by the resonator. As such, the qubit 210 may be coupled to the resonator defined by reflectors 231 and 232 yet the device shown may be formed in layers using conventional fabrication techniques, such as lithography. Moreover, the electric field of the resonator shown in FIG. 2 does not provide undesirable interactions with the qubit as is the case in device 100 shown in FIG. 1 and discussed above.

In general, device 200 may include any number of qubits such as qubit 210, since multiple qubits may be fabricated along one reflector of the resonator with some separation between them. Additionally, or alternatively, device 200 may include qubits at multiple different positions along a vertical direction of FIG. 2, such as within reflector 231 and/or within another reflector or other surface positioned above reflector 231 (not shown).

While the illustrative resonator shown in FIG. 2 includes two surfaces, namely reflectors 231 and 232, in general a resonator may be used in device 200 that includes any number of surfaces, including in some cases surfaces that prescribe a completely bounded volume. Surfaces of a resonator may also include one or more materials, at least some of which may be materials that may be operated to be superconducting (e.g., aluminum lowered to a suitable temperature at which it becomes superconducting). In some cases, a surface of a resonator may include multiple different materials.

According to some embodiments, qubit 210 may include one or more Josephson elements, which are non-linear, non-dissipative elements. As used herein with respect to a Josephson element, "nonlinear" refers to a flux-charge relationship (e.g., the inductance) of the element being nonlinear; and "non-dissipative" refers to the fact that the amount of power dissipated by the element is substantially negligible. Any suitable Josephson element may be used, including but not limited to, Josephson junctions, superconducting films, and nanowires. In the embodiments described below, Josephson junctions are used. But it should be understood that the techniques and embodiments described herein are not limited to using Josephson junctions.

Following below are more detailed descriptions of various concepts related to, and embodiments of, techniques for coupling a planar quantum system to a non-planar resonator. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

As discussed above, qubit 210 provides a dipole moment that is perpendicular to the plane of the qubit. Any suitable qubit implementation may be used that produces such an effect, although two broad classes of such qubits are discussed below. First, qubits based on patch antenna, which are discussed in relation to FIGS. 3A-3B, 4A-4B and 5; and second, qubits based on a whispering gallery mode resonator, which are discussed in relation to FIGS. 6A-6C, 7A-7B and 8.

FIG. 3A illustrates a top view of a "patch antenna" 300 that is used in some embodiments to create the aforementioned dipole perpendicular to the plane of the qubit. The patch antenna 300 is formed by removing an annular aperture 305 with an outer radius $r_o$ from a conducting sheet 310, resulting in a circular patch 320 with a radius $r_i$ (representing the inner radius of the annular aperture 305) surrounded by the remaining conducting sheet 310. FIG. 3B illustrates a cross-sectional view of the patch antenna 300, where the cross-is section taken through the center of the circular patch 320.

When a voltage is applied across the annular aperture 305 between the circular patch 320 and the conducting sheet 310, two opposing dipole moments $p_q$ are generated, as represented by arrows 330 and 331 in FIG. 3B. The dipole moments $p_q$ are not directed within the plane of the patch antenna, but are instead directed perpendicular to the plane of the patch antenna. The dipole moments are not illustrated in FIG. 3A, but point into and out of the drawing.

While a circular patch 320 is illustrated in FIGS. 3A-B, embodiments of a patch antenna are not necessarily so limited, as any suitable shape may be used to form a patch antenna. For instance, the patch 320 may instead be triangular, rectangular, polygonal, star-shaped or any other suitable shape. Moreover, both surfaces of the annular aperture 305 may be shaped to have any suitable contour. For example, the inner surface 306 of the annular aperture 305, determined by the shape of the patch 320, may be any contour. In the figure, inner surface 306 is illustrated as a circle, but the surface may be elliptical, rectangular, square and/or may include irregular or regular features such as periodic patterns (e.g., sinusoidal waves, triangular wave, square wave, etc.). Similarly, the outer surface 307 of the annular aperture 305 may be any suitable contour. Additionally, embodiments are not limited to the shape of inner surface 306 being the same shape as the outer surface 307. For example, the inner surface 306 may be circular (forming circular patch 320) while the outer surface 307 may be rectangular (forming a rectangular aperture in the conducting sheet 310. In general, any number of patches may be included within a patch antenna, being connected to one another and/or being connected to the conducting sheet (e.g., via one or more Josephson junctions).

Moreover, the patch 320 may be located anywhere within the aperture 305 as embodiments are not limited to the patch/aperture structure being circularly symmetric, nor indeed are embodiments limited to exhibiting any particular symmetry, such as 4-fold or 8-fold symmetry (though some embodiments may exhibit such a symmetry). FIGS. 3A-B illustrate a patch 320 that is circularly symmetric in that the circular patch 320 is in the center of the circular aperture 305. In some alternate embodiments, the circular patch 320 may be nearer to a first edge of the circular aperture 305 than a second edge of the aperture 305, thus producing a patch antenna that is not circularly symmetric.

The inventors have recognized and appreciated that by selecting the shape of the patch 320 and the aperture 305, as well as the location of the patch 320 within the aperture 305 the ratio of magnetic to electric coupling between the qubit and resonator can be tuned. By tuning this ratio, the resonance of the qubit may be tuned independently from the resonance of the resonator such that it is separated from the resonance of the resonator (e.g., to produce a desired dispersive coupling between the qubit and resonator).

Also, while the circular patch was described above as being formed by removing an annular aperture 305 from a thin conducting sheet 310, the patch antenna 300 may also be formed by depositing a conductive material on a substrate to from the circular patch 320 and the conducting sheet 310 resulting in the formatting of the annular aperture 305.

In some embodiments, one or more Josephson junctions may be added to the patch antenna structure described above to form a superconducting qubit. The Josephson junction may be disposed, for example, between the circular patch 320 and the conductive sheet 310 such that the two portions of the patch antenna are coupled together through the Josephson junction. A Josephson junction may be formed, for example, on a superconducting wire that forms a "bridge" between the circular patch 320 and the conductive sheet 310.

A Josephson junction may be formed, for example, by placing a thin non-superconducting tunnel layer between two superconducting layers. In some embodiments, such a non-superconducting layer may be a non-conducting material. For example, any suitable oxide, such as aluminum oxide may be used. In some embodiments, the patch antenna is formed from a superconducting material. By way of example and not limitation, the patch antenna may be formed from aluminum, niobium, indium, rhenium, tantalum, titanium nitride, niobium nitride, or combinations thereof.

While embodiments described herein illustrate only a single Josephson junction, some embodiments may include a plurality of Josephson junctions, which may be arranged in parallel or in series with one another. For example, two Josephson junctions in series may be formed on the superconducting wire connecting the circular patch 320 to the conductive sheet 310. Two Josephson junctions in parallel may be formed by using multiple "bridges" to connect the circular patch 320 to the conductive sheet 310, each bridge comprising one or more Josephson junctions.

As discussed above, a qubit such as qubit 210 shown in FIG. 2 may be embedded in a metal layer that forms a portion of a non-planar superconducting resonator. By way of example and not limitation, a three-dimensional cavity resonator or a transmission line resonator, such as a ring resonator, may be used. FIGS. 4A-4B illustrate an example of using a patch antenna, such as that described in relation to FIGS. 3A-3B that includes a Josephson junction as described above, within a three-dimensional cavity resonator.

FIG. 4A illustrates a cross-section of a quantum device 400 comprising a three-dimensional cavity. The cavity is that portion of the device that is not filled with any material (shown as white in the interior of the device in the figure). In some embodiments, the device may be placed in a vacuum during operation such that there is substantially no air in the cavity. The cavity is defined by a plurality of superconducting portions that act as walls for the cavity, including superconducting portions 412, 451, 452 and 453. In some embodiments, an interior surface of superconducting portions 451 and 452 may be substantially parallel to one another, while an interior surface of superconducting portion 452 may be substantially parallel to an interior surface of superconducting portion 412.

In some embodiments, as discussed in connection with FIGS. 3A-B, an annular shape may formed in superconducting portion 412 to form a circular patch 414. In the example of FIGS. 4A-4B, the circular patch is connected to the superconducting portion 412 via a Josephson junction 415. FIG. 4B illustrates a perspective view of the superconducting portion 412 and the patch 414. Elements of the quantum device shown in FIG. 4A other than elements 412, 414 and 415 are not illustrated in FIG. 4B for the sake of clarity.

In the example of FIGS. 4A-4B, the combination of superconducting portions 412 and 414, and Josephson junction 415, form a logical qubit. As such, this combination of elements is a suitable example of qubit 210 shown in FIG. 2.

As an illustrative way to form device 400, in some embodiments, superconducting portions 451, 452 and 453 may be formed on a substrate 450. The substrate may be formed from, by way of example and not limitation, silicon, sapphire and/or some other dielectric. In some embodiments, the superconducting portions 412, 414 and the Josephson junction 415 may be formed on a substrate 410, which may be formed from silicon, sapphire and/or some other dielectric. After each of the two substrates 410 and 450 have the respective superconducting portions and any other devices formed upon them, the two substrates may be affixed together to form the cavity illustrated in FIG. 4A. The two substrates may be affixed together in any suitable way. For example, two substrates that have been covered, at least partially, with a metal material may be bonded together using cold welding, thermocompression bonding, thermosonic bonding, eutectic bonding and/or solder reflow.

In some embodiments, the superconducting portion 412 may be formed from a single type of superconducting material. However, as illustrated in FIG. 4A, in some embodiments a first portion of the superconducting portion 412 is formed from a first superconducting material, such as aluminum (shown in shaded lines in FIGS. 4A-4B), and a second portion of the superconducting portion 412 is formed from a second superconducting material, such as indium (shown as solid black in FIGS. 4A-4B). Superconducting portions 451-453 may also be formed from the second superconducting material or a different material. According to some embodiments, superconducting portions 412 and 414 may be formed from aluminum, indium, tin, silicon carbide, or combinations thereof. As used herein, a "superconducting material" is a material that, at least under some conditions, exhibits a type of superconductivity. For instance, aluminum may be considered a "superconducting material" since it exhibits superconductivity when cooled below the transition temperature of 1.2K.

As discussed above, the Josephson junction 415 may act as a qubit that is coupled to the cavity of device 400 due to its dipole moment $p_q$ coupling to an electric field of the cavity $E_r$. While FIG. 3B illustrated two dipole moments pointing in opposing directions, only one of those two dipole moments will couple to the field supported by the cavity, since the other is directed into substrate 410. In some embodiments, a material in which the Josephson junction 415 is embedded is a material that serves as a boundary of two different cavities (e.g., via two different surfaces of the material). In this way, the Josephson junction 415 may be coupled to two cavities simultaneously due to a dipole moment above the Josephson junction coupling to an electric field of a first cavity and a dipole moment below the Josephson junction being coupled to an electric field of a second cavity.

Figure 5:
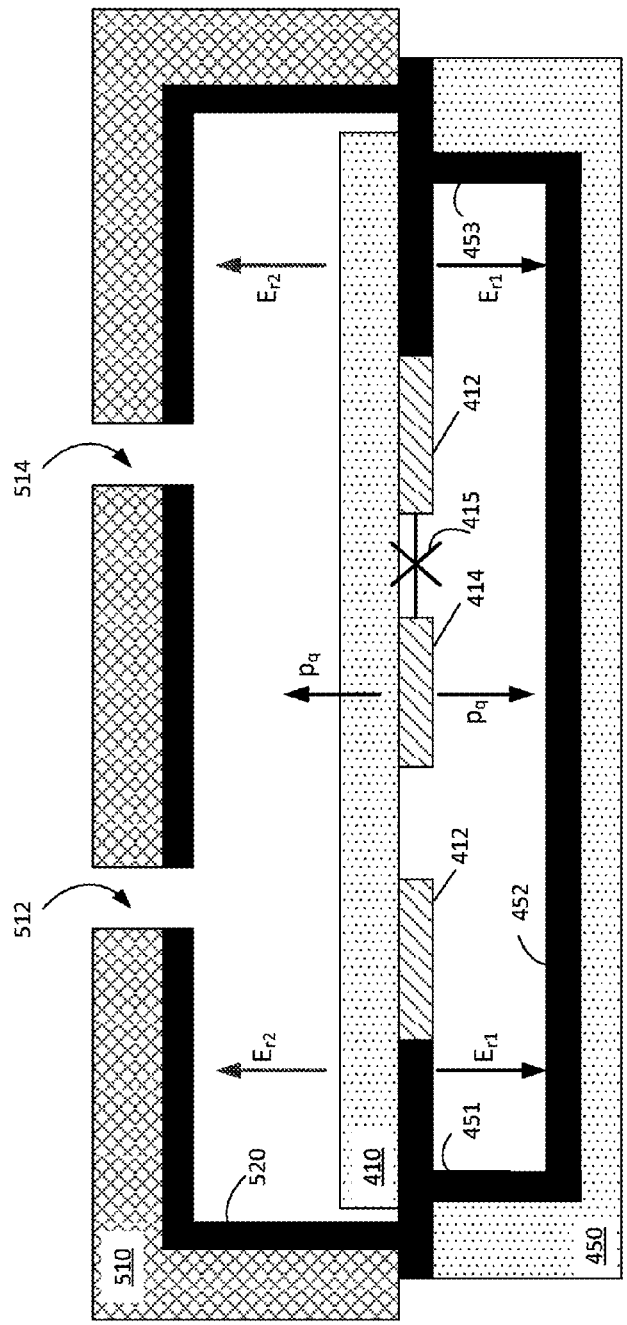
FIG. 5 is a cross-sectional view of a quantum device comprising two three-dimensional cavity resonators, according to some embodiments.

FIG. 5 illustrates one embodiment in which a Josephson junction is coupled to two cavities. The same reference numerals are used in FIG. 5 as were used in FIGS. 4A-4B to indicate equivalent features. In the example of FIG. 5, the logical qubit formed from elements 412, 414 and 415 produces a dipole moment that couples to an electric field $E_{r1}$ of a first cavity (lower as pictured) and also to an electric field $E_{r2}$ of a second cavity (upper as pictured).

In the example of FIG. 5, the second cavity is bounded by material forming a box 510 that surrounds the substrate 410. According to some embodiments, the box 510 may comprise a metal, such as copper. According to some embodiments, walls of the second cavity may be formed from superconducting material 520 coated onto the inner surface box 510. In some embodiments, input coupler 512 and output coupler 514 are formed in the metallic box 510 and the superconducting material 520 to allow microwave radiation to be coupled into and out from the second cavity.

In some embodiments, the two cavities may have different Q factors. The first cavity may, for example, have a higher Q factor than the second cavity. As such, the coupling strength between the first (lower) cavity and the logical qubit may be less than the coupling strength between the logical qubit and the second (upper) cavity. Further, the coupling between the second cavity and a measuring device (not shown in the figure) may be greater than both the coupling strength between the first cavity and the logical qubit, and the coupling strength between the logical qubit and the second cavity. In some embodiments, the first cavity may be used as a readout cavity and the second cavity may be used as a storage cavity; the relative sizes of coupling strengths and/or Q factors referred to above may facilitate such an arrangement.

Quantum devices with components of any suitable size may be used. In one embodiment, the circular patch 414 has a radius $r_i$=0.1-0.2 mm and the annular shape cut out from the superconducting portion has a radius $r_o$=0.7-0.8 mm. The substrate on which the Josephson junction is formed may have a thickness between 0.2 mm and 0.4 mm. The storage cavities may have different dimensions from one another. For example, each cavity may have a volume below 200 cm$^3$, or between 50 cm$^3$ and 150 cm$^3$ (e.g., the first cavity may measure approximately 22×24×0.3 mm, while the second cavity may measure 28×30×3 mm). The above measurements are provided by way of example, as embodiments are not limited to any particular sizes or shapes.

As discussed above, qubit 210 shown in FIG. 2 provides a dipole moment that is perpendicular to the plane of the qubit, and may for example be configured as a whispering gallery mode resonator (WGMR) or other planar multilayer device (sometimes referred to as a "2.5-dimensional device").

Figure 6A:
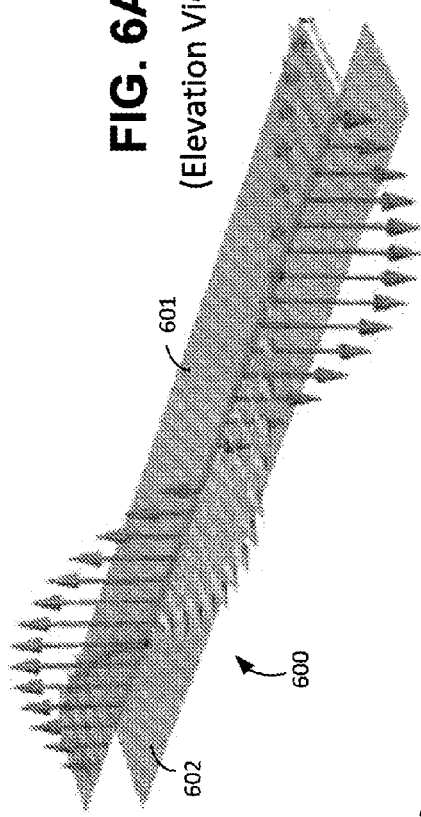
FIG. 6A is a perspective view of a parallel plate transmission line.

A WGMR is formed, conceptually, by considering a parallel plate transmission line 600 with periodic boundary conditions, as illustrated in FIG. 6A. The parallel plate transmission line 600 comprises a top plate 601 and a bottom plate 602 that formed from superconducting materials, such as aluminum or indium. The top plate 601 is parallel to the bottom plate 602. FIG. 6A illustrates the electric and magnetic field modes of the WGMR as arrows that are perpendicular and parallel, respectively, to the planes defined by the top plate 601 and the bottom plate 602.

Figure 6C:
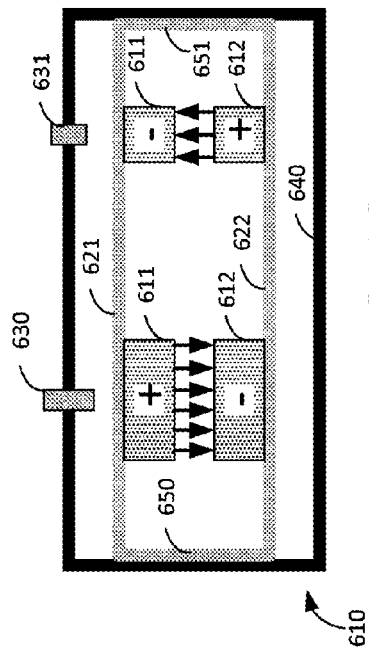
FIG. 6C is a cross-sectional view of a whispering gallery mode resonator, according to some embodiments.
Figure 6B:
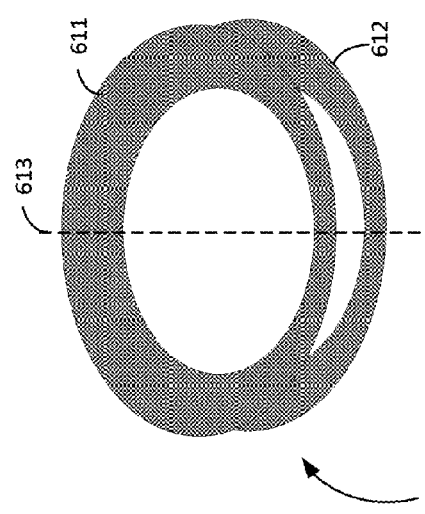
FIG. 6B is a perspective view of a whispering gallery mode resonator, according to some embodiments.

Physically, a WGMR 610 with periodic boundary condition may be formed by forming a parallel plate transmission line as a ring-like structure, as illustrated in FIG. 6B. The WGMR 610 comprises a top plate 611 and a bottom plate 612 that are parallel to one another, just as in the parallel plate transmission line 600, although in the example of FIG. 6B the transmission line forms a loop.

While a resonator may utilize a circularly symmetric pair of metal rings, in the WGMR resonator example of FIG. 6B, such circular symmetry of the ring-like structure is broken by forming the ring using two offset circles—that is, the holes in each metal ring are not centered with respect to the outer boundary of the metal ring. Thus, a symmetry plane, represented by dashed line 613, which lies parallel to the plane of each of the two metal rings and passes through the center of each of the two circles, is created.

By breaking the circular symmetry of the ring-like structure, two non-degenerate standing modes are created. The first non-degenerate standing mode is parallel to the symmetry axis and the second non-degenerate standing mode is perpendicular to the symmetry axis. The modes may further be separated into common and differential modes, where the common modes (C) have mirror charges on the upper plate 611 and the lower plate 612 and differential modes (D) have opposite charges on the upper plate 611 and lower plate 612. In some embodiments, the two differential modes of the WGMR may be considered two separate cavities for coupling to a qubit (which may be included in the WGMR resonator as described below). By way of example, and not limitation, the parallel D mode may be used as a readout cavity and the perpendicular D mode may be used a storage cavity.

FIG. 6C illustrates the parallel differential (D) mode in a cross sectional view of the WGMR 610. In the example of FIG. 6C, spacers 650 and 651 and substrates 621 and 622 are included to mechanically support the resonator formed from plates 611 and 612. In addition, coupling pins 630-631 are disposed above the ring-like structure, and may for example be used to couple microwave radiation to the WGMR. In the example of FIG. 6C, the coupling pins are located along the symmetry line 613 above the thinnest and thickest portions of the ring-like structure, although in general the coupling pins may be located in any suitable location.

As an illustrative example of a fabrication process, the device illustrated in FIG. 6C may be fabricated by forming the top plate 611 on a first substrate 621 and the bottom plate 612 on a second substrate 620. The first substrate 621 and the second substrate 622 may comprise, by way of example and not limitation, silicon and/or sapphire. The first substrate 621 and the second substrate 622 are then placed parallel to one another and held separated by a set distance by spacers 650-651, which may also be made from silicon and/or sapphire. As a non-limiting example, the distance between the two substrates may be between 0.1 mm and 0.3 mm.

The first substrate 621 and the second substrate 622 may then be bonded together using any suitable technique, such as by using Poly(methyl methacrylate) (PMMA). The resulting resonator may then be placed in a sample holder 640, which may be formed from a metal, such as aluminum. Coupling pins 630-631 may be disposed above the ring-like structure for coupling microwave radiation to the WGMR. In some embodiments, the coupling pins are located along the symmetry line 613, above the thinnest and thickest portions of the ring-like structure.

Figure 7B:
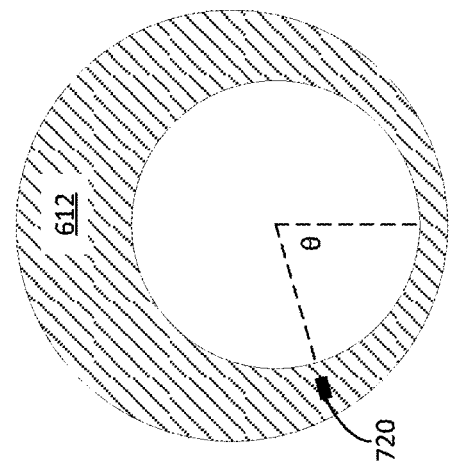
FIG. 7B is a top view of a qubit in a second location within a whispering gallery mode resonator, according to some embodiments.
Figure 7A:
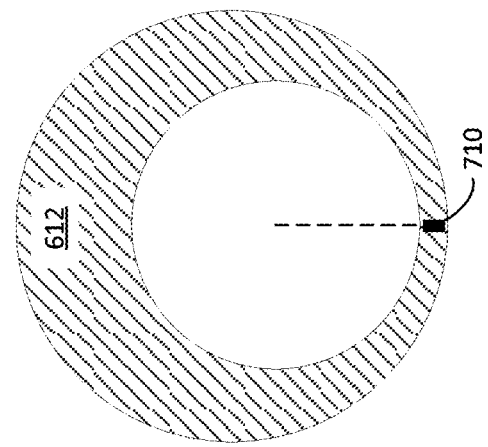
FIG. 7A is a top view of a qubit in a first location within a whispering gallery mode resonator, according to some embodiments.
Figure 8:
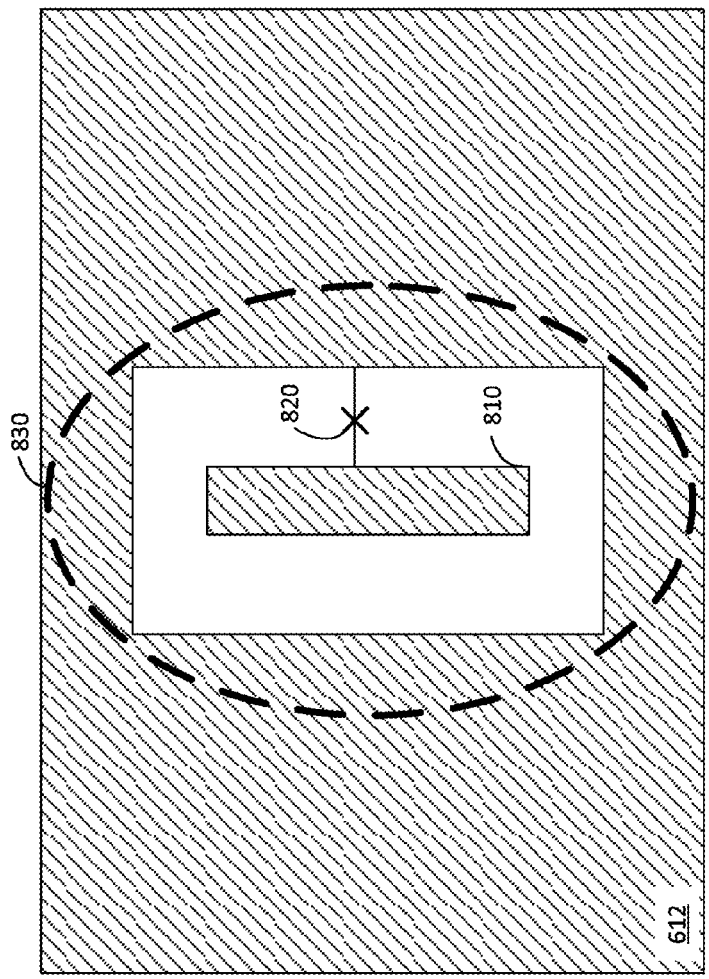
FIG. 8 is a detailed top view of a qubit in a whispering gallery mode resonator, according to some embodiments.
Figure 9:
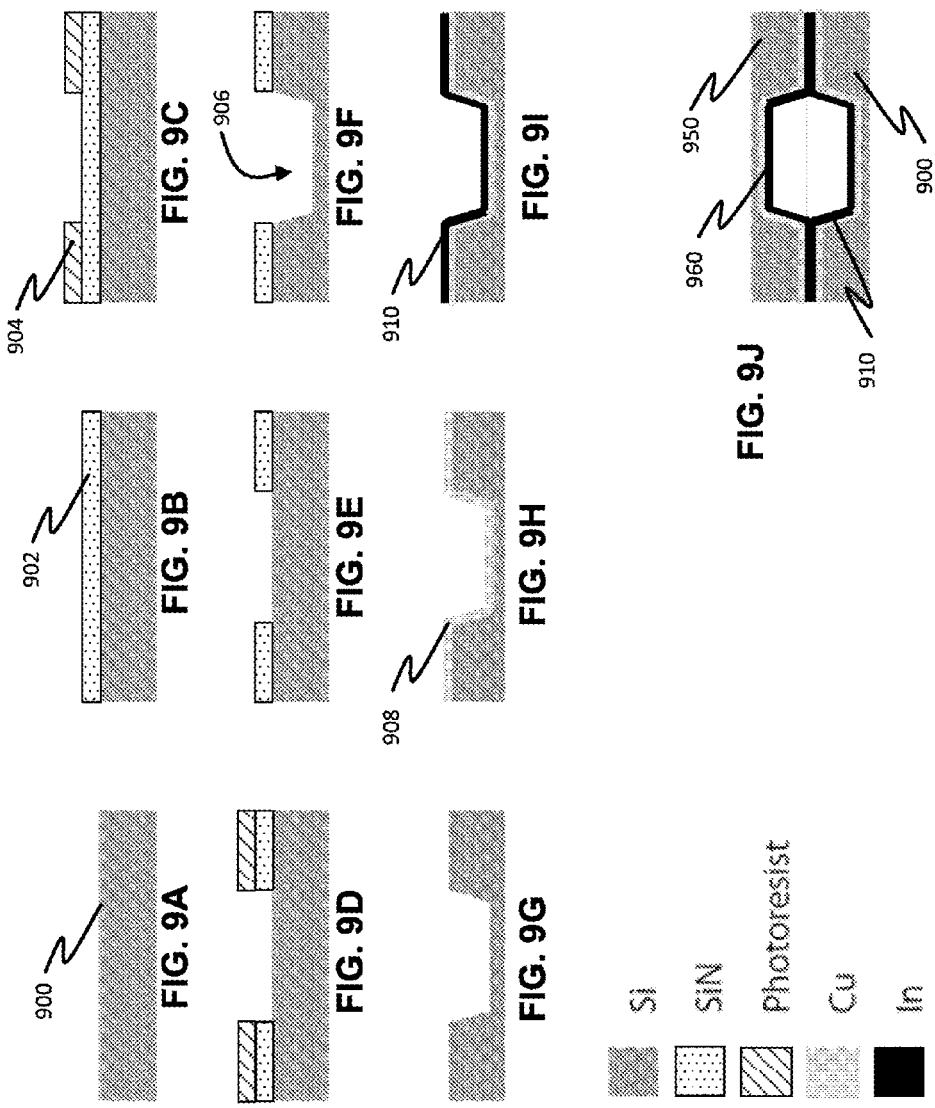
FIGS. 9A-9J illustrate cross-sectional views of acts of a method of forming a superconducting device, according to some embodiments.

As with the above-described three-dimensional cavity resonator, a qubit may be embedded in the plane of one of the superconducting walls that defines the cavity—in the case of the WGMR, either within the top plate 611 or the bottom plate 612. FIGS. 7A and 7B depict two illustrative locations for such a qubit, and FIG. 8 provides additional detail of the structure of the qubits shown in FIGS. 7A and 7B.

FIG. 7A illustrates an embodiment where a qubit 710 is located at the thinnest portion of the ring-like structure. FIG. 7B illustrates an embodiment where a qubit 720 is located at an angle θ away from the thinnest portion of the ring-like structure, where θ=0 is defined as the thinnest portion of the ring-like structure. The frequency with which the WGMR resonates is independent of the position of the qubit is located. However, the magnitude of the coupling of the qubit to the resonator varies with the position of the qubit around the ring 612. Moreover, for a given position θ, the magnitude of the coupling of the qubit to the resonator can be adjusted by changing the dimensions of the aperture in the WGMR.

With the qubit at the thinnest part of the ring (θ=0), the storage mode has maximum coupling despite the fact that the electric field at this location is zero. This coupling is mostly inductive coupling. Varying the location of the qubit changes the coupling from inductive to capacitive coupling. According to some embodiments, The Q factor of the resonators and/or the coupling of resonator radiation to each mode may be a function of the angular position of the pins 630 and 631 and/or the depth that the pins 630 and 631 protrude into the cavity.

According to some embodiments, for dispersive coupling between the qubit and a resonator mode of a WGMR that utilizes the ring 612 as shown in FIG. 7A or 7B, the strength of the cross-Kerr coupling ($\chi_{qr}$) depends primarily on the detuning (difference in frequencies) between the resonator transition frequency and the qubit transition frequency. In embodiments in which a WGMR is operated in a storage (memory) mode and in a readout mode, the cross-Kerr coupling constant between the qubit and the readout cavity ($\chi_{qr}$) and the cross-Kerr coupling constant between the qubit and the memory cavity ($\chi_{qm}$) are dependent on the location of the Josephson Junction.

FIG. 8 illustrates a top view of an illustrative qubit that may be utilized within a WGMR, such as qubit 710 shown in FIG. 7A and/or as qubit 720 shown in FIG. 7B. In the example of FIG. 8, a qubit 830 is formed from a rectangular patch 810 embedded in the plane of a bottom plate (of which plate 612 shown in FIG. 6B is depicted as an example).

The rectangular patch 810 may comprise the same superconducting material as the plate 612, and/or may comprise a different superconducting material. The plate 612 may be connected to the rectangular patch 810 via a Josephson junction 820. The qubit 830 may be located at any suitable location in the WGMR, and there may be any number of such qubits located in a lower WGMR plate and/or in an upper WGMR plate.

The superconducting devices discussed above may be fabricated in any suitable way. In some embodiments, microelectronic fabrication techniques may be used to form three-dimensional cavities for use as resonators, as described above. Alternatively, the cavities may be formed using substrates where troughs and channels are formed as desired using three-dimensional printing techniques and the superconducting layers may be formed using, for example, electroplating techniques. According to some embodiments, enclosures are created by forming a trough in a single substrate, as illustrated in FIG. 4A. Alternatively, or in addition, enclosures may be created by forming a first trough in a first substrate and a second trough in a second substrate and placing the two substrates together with the two troughs adjacent to one another. A qubit, as described above, may be formed in any one of the superconducting surfaces used to form the cavity. Methods for forming superconducting devices according to some embodiments are described below.

Figure 11:
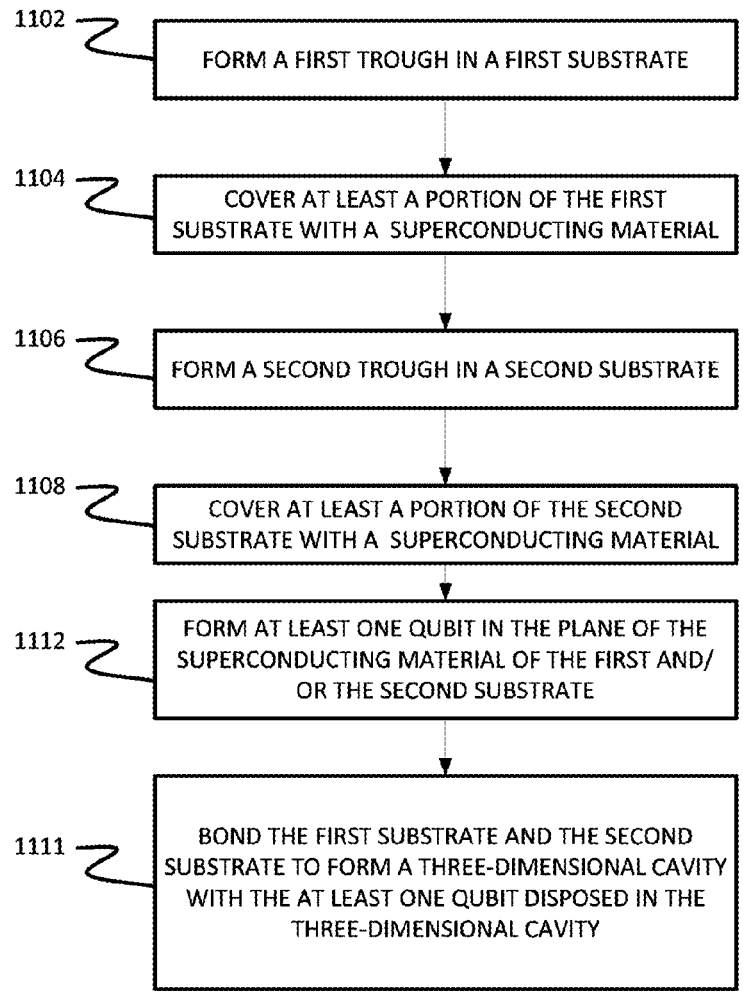
FIG. 11 is a flow chart of a method of forming a superconducting device, according to some embodiments.

FIGS. 9A-9J illustrate a cross-sectional view of a plurality of acts of an illustrative method for constructing a superconducting device, according to some embodiments. A flowchart of the corresponding acts is shown as method 1100 in FIG. 11. An initial act 1102 in FIG. 11 in which a trough is formed in a first substrate is depicted by FIGS. 9A-9G. These steps are also shown in greater detail by the acts of method 1200 shown in FIG. 12.

FIG. 9A illustrates a first substrate 900 being provided. In some embodiments, the substrate may comprise a material with a crystalline structure, such as, but not limited to, silicon or germanium. The substrate 900 may be of any suitable thickness. In the illustrated embodiments, the substrate is approximately 500 μm thick.

Figure 12:
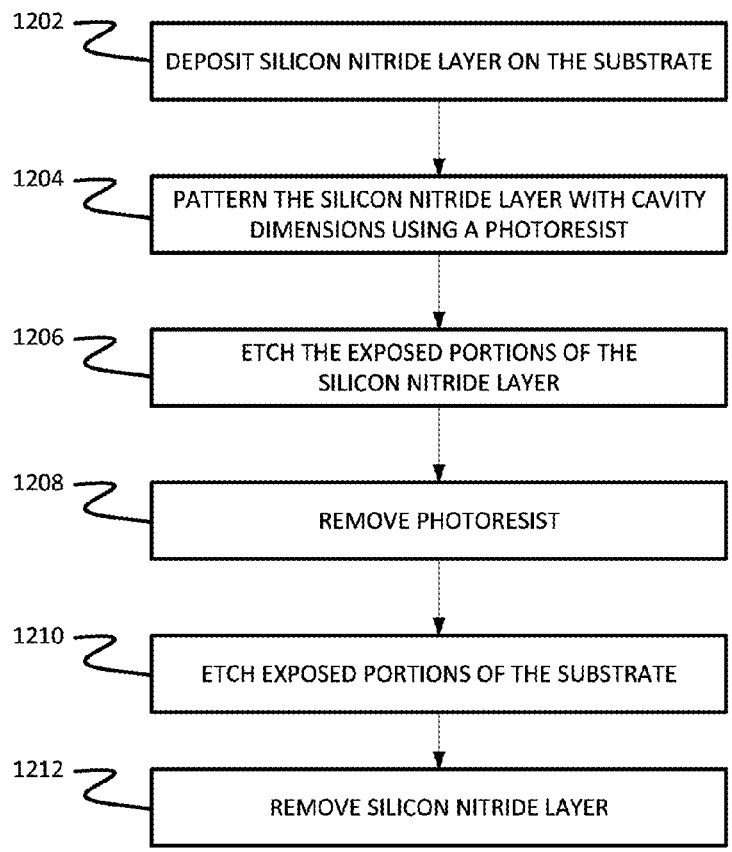
FIG. 12 is a flow chart of a method of forming a trough within a superconducting device, according to some embodiments.

The initial act 1120 of method 1100, is shown in further detail in FIG. 12. Accordingly, steps of the method 1200 will be followed for the steps depicted in FIGS. 9A-9G.

At act 1202, a mask material layer 902 is deposited on a first surface of the substrate 900 (see FIG. 9B). According to some embodiments, the mask material layer may comprise silicon nitride. At act 1204, a photoresist layer 904 is deposited on top of the mask material layer 902 (see FIG. 9C). The photoresist layer 904 is formed in a pattern based on the dimensions of the trough being formed in the substrate 900. Accordingly, the photoresist layer 904 is absent from the region above where the trough will be formed in the substrate 900 in the subsequent acts. By way of example and not limitation, the photoresist layer 904 may be formed such that an area of the silicon mask material layer 902 with dimensions 18 mm by 38 mm is left exposed.

At act 1206, the exposed portion of the mask material layer 902 is removed (see FIG. 9D). This may be achieved in any suitable way. In some embodiments, the mask material layer 902 is etched using an etchant that removes the mask material layer, but does not remove the photoresist layer 904. For example, reactive ion etching (RIE) may be used to etch the silicon nitride layer 902. The act of RIE may use, for example, $CHF_3/O_2$ as an etchant. The photoresist layer 904 is then removed at act 1208. The resulting structure is the substrate 900 partially covered with the silicon nitride layer 902 which will act as a mask for defining dimensions of the trough (see FIG. 9E).

At act 1210, the exposed portion of the substrate 900 is etched to form a trough 906. In some embodiments, the substrate 900 may be etched such that opposing surfaces of the resulting trough 906 are parallel to one another. In the embodiment shown in FIG. 9F, the trough is etched using an anisotropic wet etch using 30% KOH at 85° C. The details of the anisotropic etch is shown in more detail in FIG. 10.

Figure 10:
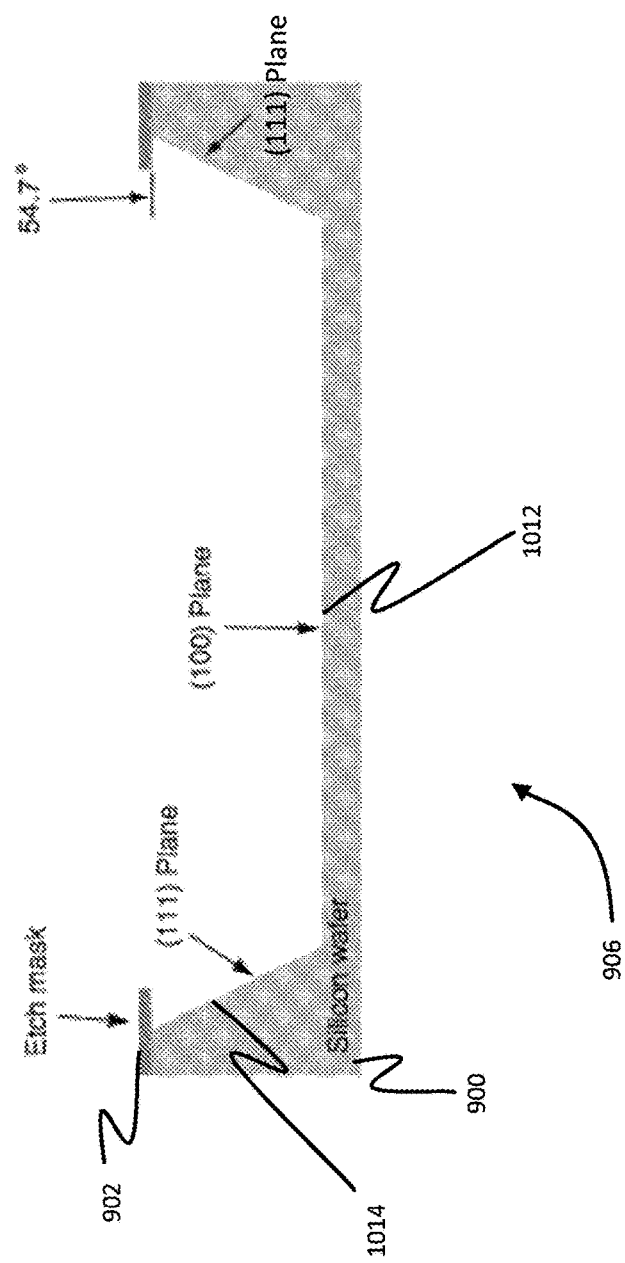
FIG. 10 illustrates a trough resulting from an anisotropic wet etch, according to some embodiments.

FIG. 10 illustrates the trough 906 resulting from an anisotropic wet etch. Because of the crystalline structure of the silicon substrate 900, the (100) plane 1012 and the (111) 1014 plane for a 54.7° angle as a result of the etching act. In some embodiments, the anisotropic wet etch results in surfaces 1012 and 1014 that are atomically smooth. Thus, when covered in a superconducting layer the surface of the resulting enclosure will be substantially free from defects. If the enclosure is configured for use as a three-dimensional cavity resonator, the smooth surfaces result in a high Q factor cavity.

At act 1212, the mask material layer 902 is removed resulting in the substrate 900 including the trough 906 (see FIG. 9G). While FIG. 12 illustrated one embodiment of a method for creating a trough in a substrate, any suitable method may be used. For example, laser machining or three-dimensional printing may be used to form a substrate with a trough.

Returning to FIG. 11, after the trough 906 is formed in a substrate at act 1102 the method 1100 continues at act 1104, where at least a portion of the first substrate 900 is covered with a superconducting material. In some embodiments, all the surfaces of the trough in the substrate may be covered. In other embodiments, only portions of the surfaces may be covered. For example, the patch and aperture structure described above may be formed in at least one of the surfaces formed from the superconducting material. Also, other apertures may be formed for, e.g., coupling electromagnetic radiation into the cavity. In some embodiments, portions of the substrate outside of the region associated with the trough may also be covered with a superconducting layer.

The superconducting layer may be formed in any suitable way. For example, FIGS. 9H-I illustrate one particular method for forming a superconducting layer 910 that covers at least a portion of the substrate. FIG. 9H illustrates a thin seed layer 908 deposited over the surface of the substrate 900. This may be done in any suitable way. In some embodiments, copper is deposited via evaporation techniques to form the seed layer 908. Any suitable thickness of seed layer may be used. For example, the seed layer 908 may be approximately 200 nm thick. While copper is used as an example material for the seed layer 908, any suitable material may be used.

FIG. 9I illustrates a superconducting layer 910 formed on the seed layer 908. This may be done in any suitable way.

For example, a superconducting material 910 may be electroplated onto the seed layer 908. The superconducting layer 910 may be formed with any suitable thickness. For example, the superconducting layer 910 may be approximately 9 μm thick. Any suitable superconducting material may be used. For example, the superconducting layer may comprise aluminum, niobium, indium, rhenium, tantalum, titanium nitride, niobium nitride or combinations thereof.

At act 1106, a second trough is formed in a second substrate 950. The act of forming the second trough may be achieved using the same techniques described in connection with act 1102, FIG. 9 and FIG. 12. However, the formation of the second trough is optional. An enclosure may be formed from a single trough in a first substrate without forming a second trough in a second substrate.

At act 1108, at least a portion of the second substrate 950 is covered with a superconducting material 960. This act may be achieved using the techniques described in connection with act 1104. In embodiments where a second trough is formed in the second substrate 950, at least a portion of every surface of the trough may be covered with a superconducting layer 960. In some embodiments, a portion of the second substrate outside of the trough region may be at least partially covered with a superconducting layer.

At act 1110, at least one superconducting qubit is formed in the plane of the superconducting layer of at least one of the first substrate and the second substrate. This act may be performed at the time the superconducting layers are formed on the substrate. However, in other embodiments, the superconducting qubit may be formed prior to or after covering the trough with superconducting material. In some embodiments, act 1110 may be omitted as superconducting devices may be formed with an enclosure and without a superconducting qubit.

At act 1112, the first substrate and the second substrate are bonded together to form an enclosure (see FIG. 9J). In embodiments where the first trough was formed in the first substrate and a second trough was formed in the second substrate, the two troughs are positioned adjacent to one another such that the enclosure is formed from both troughs together. In some embodiments where at least one superconducting qubit is to be enclosed by an enclosure, the support layer is suspended across the first trough prior to bonding the two substrates together. Accordingly, the at least one qubit in and/or on the support layer is disposed within the enclosure.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A quantum circuit, comprising:
   a resonator having a plurality of superconducting surfaces and configured to support at least one electromagnetic oscillation mode within a three-dimensional region defined by walls on which are disposed the plurality of superconducting surfaces; and
   a physical qubit disposed in an opening in one of the walls.

2. The system of claim 1, wherein the physical qubit comprises at least one planar component that includes at least one Josephson element.

3. The system of claim 2, wherein the at least one planar component includes a superconducting patch antenna.

4. The system of claim 3, wherein the superconducting patch antenna comprises a patch with a circular shape.

5. The system of claim 3, wherein the superconducting patch antenna comprises a patch with a rectangular shape.

6. The system of claim 3, wherein a superconducting patch of the superconducting patch antenna is connected to the first superconducting surface via at least one Josephson element.

7. The system of claim 1, wherein the resonator is a three dimensional cavity resonator.

8. The system of claim 1, wherein the resonator is a whispering gallery mode resonator.

9. The system of claim 8, wherein the whispering gallery mode resonator includes the first superconducting surface and a second superconducting surface parallel to the first superconducting surface, and wherein the first superconducting surface is separated from the second superconducting surface by a first distance.

10. The system of claim 9, wherein the whispering gallery mode resonator supports at least two electromagnetic oscillation modes.

11. The system of claim 10, wherein the at least two electromagnetic oscillation modes are differential modes.

12. The system of claim 10, wherein a first electromagnetic oscillation mode of the at least two electromagnetic oscillation modes is a parallel mode.

13. The system of claim 12, wherein a second electromagnetic oscillation mode of the at least two electromagnetic oscillation modes is a perpendicular mode.

14. The system of claim 9, wherein the first superconducting surface is a first ring-like structure and the second superconducting surface is a second ring-like structure.

15. The system of claim 14, wherein the first ring-like structure is circularly asymmetric such that a first width of the first ring-like structure in a first plane at a first location is less than a second width of the first ring-like structure in the first plane at a second location, different from the first location.

16. The system of claim 1, wherein the quantum mechanical system comprises a plurality of resonators.

17. The system of claim 16, wherein a first resonator of the plurality of resonators is a readout cavity.

18. The system of claim 17, wherein a second resonator of the plurality of resonators is a storage cavity.

19. The system of claim 1, wherein:
the plurality of superconducting surfaces include a first superconducting surface that defines a first plane;
the opening is in a first wall on which the first superconducting surface is disposed; and
the physical qubit comprises at least one planar component that is within the first plane.

* * * * *